(12) United States Patent
Kitahara et al.

(10) Patent No.: US 11,127,916 B2
(45) Date of Patent: Sep. 21, 2021

(54) LIGHT EMITTING DEVICE

(71) Applicant: PIONEER CORPORATION, Tokyo (JP)

(72) Inventors: Hiroaki Kitahara, Kawasaki (JP); Shigenori Murakami, Kawasaki (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/081,885

(22) PCT Filed: Mar. 3, 2016

(86) PCT No.: PCT/JP2016/056672
§ 371 (c)(1),
(2) Date: Aug. 31, 2018

(87) PCT Pub. No.: WO2017/149733
PCT Pub. Date: Sep. 8, 2017

(65) Prior Publication Data
US 2019/0074473 A1 Mar. 7, 2019

(51) Int. Cl.
*H01L 51/52* (2006.01)
*H01L 51/50* (2006.01)

(52) U.S. Cl.
CPC .......... *H01L 51/5218* (2013.01); *H01L 51/50* (2013.01); *H01L 51/5225* (2013.01); *H01L 51/5234* (2013.01); *H01L 51/5268* (2013.01)

(58) Field of Classification Search
CPC ........................ H01L 51/5268; H01L 51/5225
See application file for complete search history.

(56) References Cited

U.S. PATENT DOCUMENTS

| | | |
|---|---|---|
| 7,511,422 B2 | 3/2009 | Kato |
| 7,674,407 B2 | 3/2010 | Takakuwa et al. |
| 7,928,649 B2 | 4/2011 | Shimoji |
| 8,963,414 B2 | 2/2015 | Sawabe et al. |
| 9,349,981 B2 | 5/2016 | Kim et al. |
| 9,530,979 B2 | 12/2016 | Kim et al. |

(Continued)

FOREIGN PATENT DOCUMENTS

| | | |
|---|---|---|
| JP | 2005116193 A | 4/2005 |
| JP | 2006023683 A | 1/2006 |

(Continued)

OTHER PUBLICATIONS

International Search Report issued in PCT Application No. PCT/JP2016/056672 dated May 31, 2016 in 2 pages.

*Primary Examiner* — Jamie C Niesz
(74) *Attorney, Agent, or Firm* — Procopio, Cory, Hargreaves & Savitch LLP

(57) ABSTRACT

An optically functional layer (160) is formed over a part of a second surface (100*b*) of a substrate (100). A first electrode (110) is formed over the optically functional layer (160), and a second electrode (130) is formed over the first electrode (110). An organic layer (120) is located between the first electrode (110) and the second electrode (130) and includes a light emitting layer. A plurality of the second electrodes (130) are formed. At least a part of a region between the plurality of second electrodes (130) has optical transparency. At least a part of an edge of the second electrode (130) is located outside the optically functional layer (160).

6 Claims, 17 Drawing Sheets

(56) References Cited

U.S. PATENT DOCUMENTS

| | | | |
|---|---|---|---|
| 9,666,828 B2 | 5/2017 | Lg Display Co Ltd | |
| 9,698,366 B2 | 7/2017 | Kim et al. | |
| 9,716,242 B2 | 7/2017 | Kim et al. | |
| 2005/0073251 A1 | 4/2005 | Kato | |
| 2006/0007552 A1 | 1/2006 | Takakuwa et al. | |
| 2009/0097234 A1 | 4/2009 | von Malm | |
| 2009/0174319 A1* | 7/2009 | Shimoji | H05B 33/28 313/504 |
| 2013/0182418 A1* | 7/2013 | Sawabe | H01L 51/5212 362/157 |
| 2014/0183472 A1* | 7/2014 | Kim | H01L 27/326 257/40 |
| 2014/0374731 A1 | 12/2014 | Kim et al. | |
| 2014/0374734 A1 | 12/2014 | Kim et al. | |
| 2014/0374735 A1 | 12/2014 | Kim et al. | |
| 2015/0001525 A1 | 1/2015 | Kim et al. | |
| 2015/0104891 A1 | 4/2015 | Kim et al. | |

FOREIGN PATENT DOCUMENTS

| | | |
|---|---|---|
| JP | 2009152148 A | 7/2009 |
| JP | 2010272471 A | 12/2010 |
| JP | 2013149376 A | 8/2013 |
| JP | 2015515720 A | 5/2015 |
| JP | 2016009571 A | 1/2016 |

\* cited by examiner

LIGHT EMITTING DEVICE

CROSS-REFERENCE TO RELATED APPLICATIONS

This application is a U.S. National Stage entry of PCT Application No: PCT/JP2016/056672 filed Mar. 3, 2016, the contents of which are incorporated herein by reference.

TECHNICAL FIELD

The present invention relates to a light emitting device.

BACKGROUND ART

In recent years, the development of alight emitting device using an organic EL has advanced. The light emitting device is used as a lighting device and a display device and has a structure in which an organic layer is sandwiched between a first electrode and a second electrode. In general, a transparent material is used for the first electrode, and a metal material is used for the second electrode.

One of the light emitting devices using the organic EL is a technology disclosed in Patent Document 1. In the technique of Patent Document 1, a second electrode is provided only on a part of a substrate in order to make an organic EL element have optical transparency (see-through properties). In such a structure, since the regions located between the plurality of second electrodes transmit light, the organic EL element can have optical transparency.

Further, Patent Document 1 describes forming a light scattering layer between the substrate and the first electrode. This light scattering layer is not formed in the region through which light is transmitted.

RELATED DOCUMENT

Patent Document

[Patent Document 1] Japanese Published Patent Application A-2013-149376

SUMMARY OF THE INVENTION

Technical Problem

When the light scattering layer is provided between the substrate and the first electrode, light extraction efficiency from a light emitting portion such as an organic EL element is improved. On the other hand, in a light emitting device having optical transparency, there are cases where the light emitted by the light emitting unit is desired to be emitted only from one surface. In such a case, if the above-described light scattering layer is provided, there is a possibility that part of the light emitted by the light emitting unit is emitted from a surface of the light emitting device from which light is desirably not emitted or a surface thereof from which light emission is desirably restricted.

An exemplary problem to be solved by the present invention is to provide a light emitting device having optical transparency capable of improving light extraction efficiency and preventing part of light emitted by a light emitting unit from being emitted from a surface from which light is desirably not emitted.

Solution to Problem

The invention described in claim 1 is a light emitting device including: a substrate; an optically functional layer located over a part of the substrate; a light-transmissive first electrode located over the optically functional layer; a light-reflective second electrode located over the first electrode; and a light emitting layer located between the first electrode and the second electrode, in which a plurality of the second electrodes are formed over the substrate, at least a part of each of regions between the plurality of second electrodes has optical transparency, and at least a part of an edge of the second electrode is located outside the optically functional layer.

BRIEF DESCRIPTION OF THE DRAWINGS

The foregoing and other objects, features and advantages will become more apparent from the following description of preferred example embodiments and the accompanying drawings.

DESCRIPTION OF EMBODIMENTS

Figure 1:
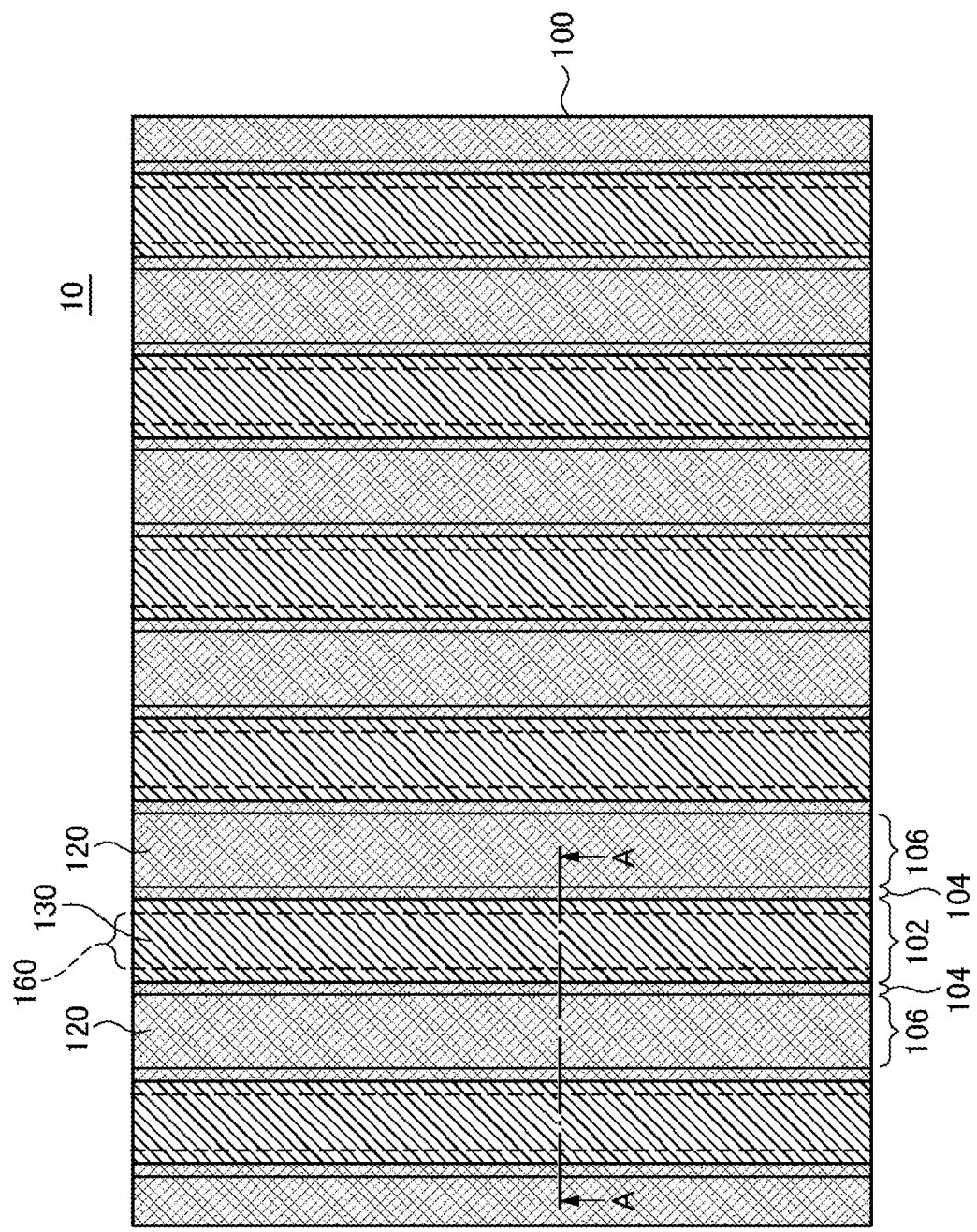
FIG. 1 is a plan view showing a configuration of a light emitting device according to an embodiment.

Hereinafter, embodiments of the present invention will be described with reference to the drawings. In all the drawings, the same components are denoted by the same reference numerals, and the description thereof will not appropriately be repeated.

Embodiment

Figure 2:
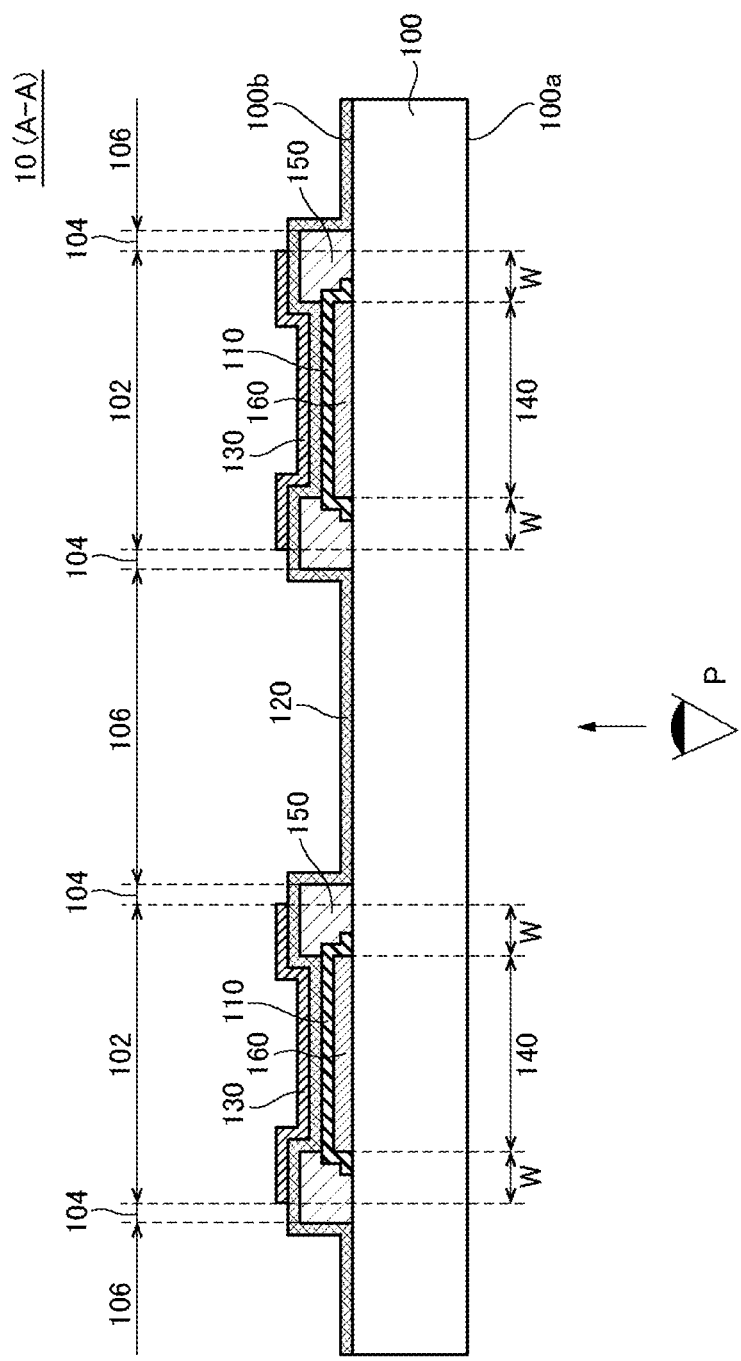
FIG. 2 is a cross-sectional view taken along line A-A of FIG. 1.

FIG. 1 is a plan view showing a configuration of a light emitting device 10 according to an embodiment. FIG. 2 is a cross-sectional view taken along line A-A of FIG. 1. The light emitting device 10 according to an embodiment includes a substrate 100, an optically functional layer 160, a first electrode 110, an organic layer 120, and a second electrode 130. The optically functional layer 160 is formed over a part of the second surface 100b of the substrate 100. The first electrode 110 is formed over the optically functional layer 160, and the second electrode 130 is formed over the first electrode 110. The organic layer 120 is located between the first electrode 110 and the second electrode 130 and includes a light emitting layer. A plurality of second electrodes 130 are formed. At least a part of a region (hereinafter referred to as a second region 104 and a third region 106) between the plurality of second electrodes 130 has optical transparency. At least a part of an edge of the second electrode 130 is located outside the optically functional layer 160. Hereinafter, the light emitting device 10 will be described in detail.

The substrate 100 is a light-transmitting substrate such as a glass substrate or a resin substrate, for example. The substrate 100 may have flexibility. In the case of having flexibility, the thickness of the substrate 100 is, for example, 10 μm or more and 1000 μm or less. The substrate 100 is, for example, a polygon such as a rectangle or a circle. In a case where the substrate 100 is a resin substrate, the substrate 100 is formed using, for example, polyethylene naphthalate (PEN), polyethersulfone (PES), polyethylene terephthalate (PET), or polyimide. Further, in the case where the substrate 100 is a resin substrate, an inorganic barrier film such as $SiN_x$ or SiON is preferably formed on at least one surface (preferably both surfaces) of the substrate 100 in order to suppress moisture from permeating through the substrate 100. In addition, in a case where the substrate 100 is formed of a resin substrate, there are a method of directly forming a first electrode 110 and an organic layer 120, to be described later, on the resin substrate, and a method in which a first electrode 110 and subsequent layers are formed over a glass substrate, then the first electrode 110 and the glass substrate are separated, and the separated stacked body is placed on a resin substrate.

A light emitting unit 140 is formed on the second surface 100b of the substrate 100. The light emitting unit 140 has a structure in which a first electrode 110, an organic layer 120 including a light emitting layer, and a second electrode 130 are stacked in this order. The first surface 100a of the substrate 100 is a surface from which light is emitted.

The first electrode 110 is a transparent electrode having optical transparency. The material of the transparent electrode is a metal-containing material, for example, a metal oxide such as Indium Tin Oxide (ITO), Indium Zinc Oxide (IZO), Indium Tungsten Zinc Oxide (IWZO), or Zinc Oxide (ZnO). The thickness of the first electrode 110 is, for example, 10 nm or more and 500 nm or less. The first electrode 110 is formed by, for example, a sputtering method or a vapor deposition method. Note that the first electrode 110 may be a carbon nanotube or a conductive organic material such as PEDOT/PSS. In addition, the first electrode 110 may have a stacked structure in which a plurality of films are stacked. In FIG. 2, a plurality of rectangular (striped) first electrodes 110 are formed in parallel to each other over the substrate 100. Therefore, the first electrode 110 is located neither in the third region 106 nor the second region 104 to be described later.

The organic layer 120 has a structure, for example, in which a hole injection layer, a light emitting layer, and an electron injection layer are stacked in this order. A hole transport layer may be formed between the hole injection layer and the light emitting layer. Further, an electron transport layer may be formed between the light emitting layer and the electron injection layer. The organic layer 120 may be formed by a vapor deposition method. Further, at least one layer of the organic layer 120, for example, a layer in contact with the first electrode 110, may be formed by a coating method such as an inkjet method, a printing method, or a spray method. In this case, the remaining layers of the organic layer 120 are formed by a vapor deposition method. In addition, all the layers of the organic layer 120 may be formed by a coating method. Note that another light emitting layer (for example, an inorganic light emitting layer) may be provided instead of the organic layer 120. Further, the emission color of light emitted from the light emitting layer (or the color of the light radiated from the organic layer 120) may be the same or different from the emission color of light emitted from the light emitting layer (or the color of the light radiated from the organic layer 120) of the adjacent light emitting unit 140.

The second electrode 130 has a light shielding property or a light reflecting property, and includes, for example, a metal selected from a first group consisting of Al, Au, Ag, Pt, Mg, Sn, Zn, and In, or a metal layer made of an alloy of a metal selected from the first group. The thickness of the second electrode 130 is, for example, 10 nm or more and 500 nm or less. However, the second electrode 130 may be formed using the material exemplified as the material of the first electrode 110. The second electrode 130 is formed by, for example, a sputtering method or a vapor deposition method. In the example shown in FIG. 1, the light emitting device 10 has a plurality of linear second electrodes 130. The second electrode 130 is provided for each of the first electrodes 110 and is wider than the first electrode 110. Therefore, when viewed from a direction perpendicular to the substrate 100, the entire first electrode 110 is overlapped and covered by the second electrode 130 in the width direction. By adopting such a configuration, it is possible to adjust the direction in which the light emitted from the light emitting layer of the organic layer 120 is extracted. Specifically, it is possible to suppress the radiation of light in the direction opposite to the first surface 100a of the light emitting device 10 (in the direction of the second surface 100b to be described later).

The edge of the first electrode 110 is covered by an insulating layer 150. The insulating layer 150 is formed of a resin material such as polyimide and a photosensitive material and surrounds the portion of the first electrode 110 to be the light emitting unit 140. The edge of the second electrode 130 in the width direction is located over the insulating layer 150. In other words, when viewed from a direction perpendicular to the substrate 100, a part of the insulating layer 150 protrudes from the second electrode 130. In the example shown in FIG. 2, the organic layer 120 is also formed on the top and side surfaces of the insulating layer 150. However, the organic layer 120 is preferably electrically separated between the adjacent light emitting units 140 or may be formed continuously with the adjacent light emitting units 140.

A plurality of light emitting units 140 extend in parallel to each other. In the example shown in FIG. 1, each of the plurality of light emitting units 140 extends in a rectangular shape (in a striped pattern). However, the light emitting unit 140 may be curved in some parts.

When viewed from a direction perpendicular to the substrate 100, the substrate 100 has a first region 102, a second region 104, and a third region 106. The first region 102 is a region overlapping the second electrode 130. In the case where the second electrode 130 has a light shielding property, the first region 102 is an region that does not allow light to pass through from each of the light emitting device 10, the front surface of the substrate 100 to the back surface, or from the back surface to the front surface. The second region 104 is an region overlapping the insulating layer 150 and not overlapping the second electrode 130. The third region 106 is an region overlapping neither the insulating layer 150 nor the second electrode 130. Since the width of the second region 104 is narrower than the width of the third region 106, the light emitting device 10 has sufficient optical transparency.

In the example shown in FIGS. 1 and 2, the organic layer 120 is also formed on the second region 104 and the third region 106. In other words, the organic layers 120 of the plurality of light emitting units 140 are continuously formed. However, the organic layer 120 need not be formed in the third region 106. In addition, the organic layer 120 need not be formed in the second region 104.

The width of the second region 104 is narrower than the width of the third region 106. The width of the third region 106 may be wider or narrower than the width of the first region 102. In a case where the width of the first region 102 is 1, the width of the second region 104 is, for example, 0 or more (or more than 0 or 0.1 or more) and 0.2 or less, and the width of the third region 106 is, for example, 0.3 or more and 2 or less. Further, the width of the first region 102 is, for example, 50 µm or more and 500 µm or less, the width of the second region 104 is, for example, 0 µm or more (or more than 0 µm) and 100 µm or less, and the width of the third region 106 is 15 µm or more and 1000 µm or less.

An optically functional layer 160 is formed in the first region 102 of the second surface 100b of the substrate 100. The optically functional layer 160 is, for example, a layer that scatters light and has a plurality of particles mixed in a binder made of an organic material or an inorganic material, for example. The optically functional layer 160 is located between the first electrode 110 and the substrate 100. The thickness of the optically functional layer 160 is, for example, 100 nm or more and 100 µm or less. More specifically, the optically functional layer 160 is formed at positions overlapping each of the plurality of second electrodes 130. Similar to the second electrodes 130, the plurality of optically functional layers 160 extend parallel to each other in a striped pattern. The optically functional layer 160 scatters the light emitted by the light emitting unit 140.

The binder (base material) of the optically functional layer 160 may be, for example, an imide-based, acrylic-based, ether-based, silane-based, or siloxane-based organic material, or may be an inorganic material such as glass paste, glass frit or $SiO_2$ sol. The refractive index of the binder of the optically functional layer 160 is, for example, 1.2 or more and 2.2 or less, preferably 1.6 or more and 1.9 or less.

The particles of the optically functional layer 160 are made of, for example, an inorganic material. The material constituting the particles is, for example, an oxide such as titanium oxide, zirconium oxide, and silicon oxide. For example, the average value of the particle size, for example, the sphere equivalent diameter (diameter) is, for example, 100 nm or more and 5 µm or less.

The optically functional layer 160 may be a diffraction grating, a micro prism, a microlens array, or a transflective film.

At least a portion of the optically functional layer 160 overlapping the light emitting unit 140 is preferably covered by the second electrode 130. To achieve such configuration, for example, the edge of the second electrode 130 may be prevented from overlapping the optically functional layer 160 in the width direction of the optically functional layer 160, in other words, the edge of the second electrode 130 may be located outside of the optically functional layer 160. A distance w between the edge of the optically functional layer 160 and the edge of the second electrode 130 is preferably, for example, 1 µm or more, and is preferably 100 µm or less.

Next, a method of manufacturing the light emitting device 10 will be described. First, the optically functional layer 160 is formed over the second surface 100b of the substrate 100. The optically functional layer 160 can be formed by, for example, an inkjet method. Further, the optically functional layer 160 can be formed by a coating method using a mask. At this time, as a coating material, a binder containing particles is used. Next, the first electrode 110, the organic layer 120, and the second electrode 130 are formed in this order.

In the present embodiment, a portion of the light emitting device 10 overlapping the third region 106 has optical transparency. Therefore, the light emitting device 10 has optical transparency in each of a direction from the second surface 100b toward the first surface 100a and a direction from the first surface 100a toward the second surface 100b. On the other hand, the second electrode 130 of the light emitting unit 140 has light reflecting properties or light shielding properties. Therefore, the light from the organic layer 120 is emitted from the first surface 100a side to the outside of the light emitting device 10 but is not emitted to the opposite side of the first surface 100a.

Further, in the present embodiment, the optically functional layer 160 is formed between the first electrode 110 and the substrate 100. Thus, the light from the organic layer 120 is easily radiated to the outside from the first surface 100a.

On the other hand, when the optically functional layer 160 is provided, part of the light traveling from the organic layer 120 to the optically functional layer 160 may be reflected to the side opposite to the first surface 100a. On the other hand, in the present embodiment, the edge of the second electrode 130 does not overlap the optically functional layer 160 and is located outside the optically functional layer 160. Therefore, the light reflected from the optically functional layer 160 to the side opposite to the first surface 100a is reflected again toward the substrate 100 by the second electrode 130. Accordingly, even if the optically functional layer 160 is provided, the light from the light emitting unit 140 is hardly emitted to the side opposite to the first surface 100a.

In the above-described embodiment and each modification example described later, the light emitting units 140 are in a striped pattern. However, the light emitting units 140 may have a lattice shape. In this case, the third region 106 is a region of the substrate 100 surrounded by the second electrode 130.

Modification Example 1

Figure 3:
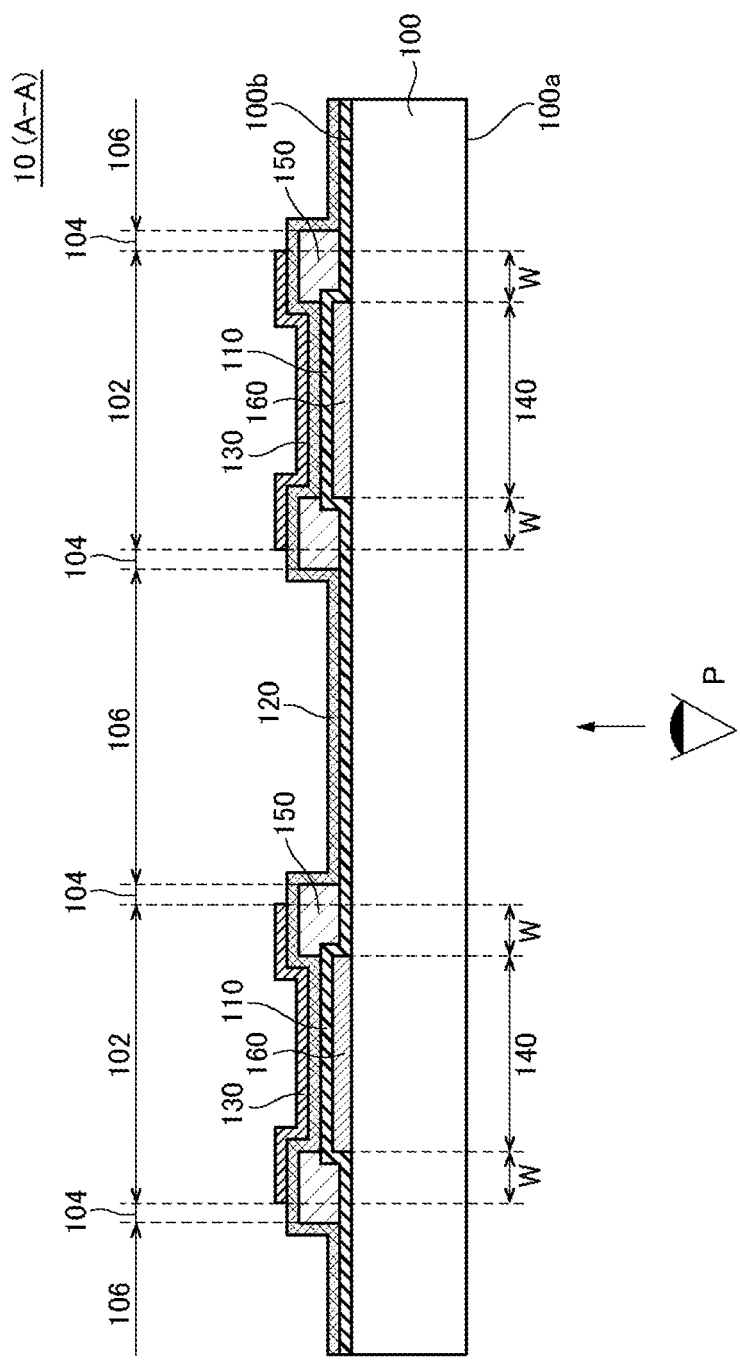
FIG. 3 is a cross-sectional view showing a configuration of a light emitting device according to Modification Example 1.

FIG. 3 is a cross-sectional view showing a configuration of the light emitting device 10 according to Modification Example 1 and corresponds to FIG. 2 in the embodiment. The light emitting device 10 according to the present embodiment has the same configuration as that of the light emitting device 10 according to the embodiment, except that the first electrode 110 is formed in all of the first region 102, the second region 104, and the third region 106. In other words, the first electrodes 110 of the plurality of light emitting units 140 are connected to each other.

Even in the present modification example, since the optically functional layer 160 is provided, similar to the embodiment, the light from the organic layer 120 is easily radiated to the outside from the first surface 100a. Further, since the edge of the second electrode 130 does not overlap the optically functional layer 160, even if the optically functional layer 160 is provided, the light from the light emitting unit 140 is hardly emitted to the side opposite to the first surface 100a. Further, the first electrodes 110 of the plurality of light emitting units 140 are connected to each other. Accordingly, there is no need to pattern the first electrode 110, and as a result, the manufacturing cost of the light emitting device 10 is reduced.

Modification Example 2

Figure 4:
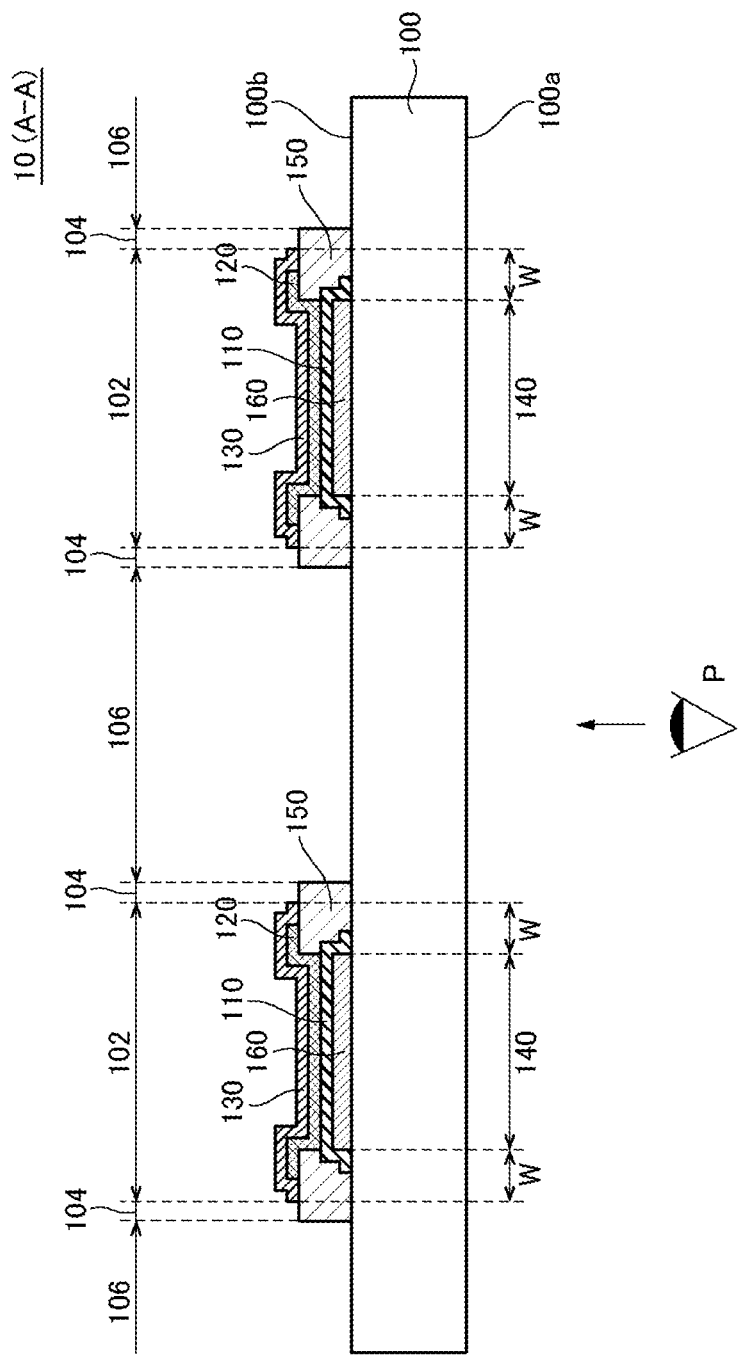
FIG. 4 is a cross-sectional view showing a configuration of a light emitting device according to Modification Example 2.

FIG. 4 is a cross-sectional view showing a configuration of the light emitting device 10 according to Modification Example 2 and corresponds to FIG. 2 in the embodiment. The light emitting device 10 according to the present modification example has the same configuration as that of the light emitting device 10 according to the embodiment, except that the organic layer 120 is divided between adjacent light emitting units 140. For example, the organic layer 120 is not formed in a part or all of the third region 106. The organic layer 120 need not be formed in the region of the second region 104 on the side of the third region 106. However, the organic layer 120 may be formed in the second region 104 and in a region of the third region 106 on the side of the second region 104.

Even in the present modification example, since the optically functional layer 160 is provided, similar to the embodiment, the light from the organic layer 120 is easily radiated to the outside from the first surface 100a. Further, since the edge of the second electrode 130 is located outside the optically functional layer 160, even if the optically functional layer 160 is provided, the light from the light emitting unit 140 is hardly emitted to the side opposite to the first surface 100a.

In Modification Example 1, the organic layer 120 may have a structure similar to that of the present modification example.

Modification Example 3

Figure 5:
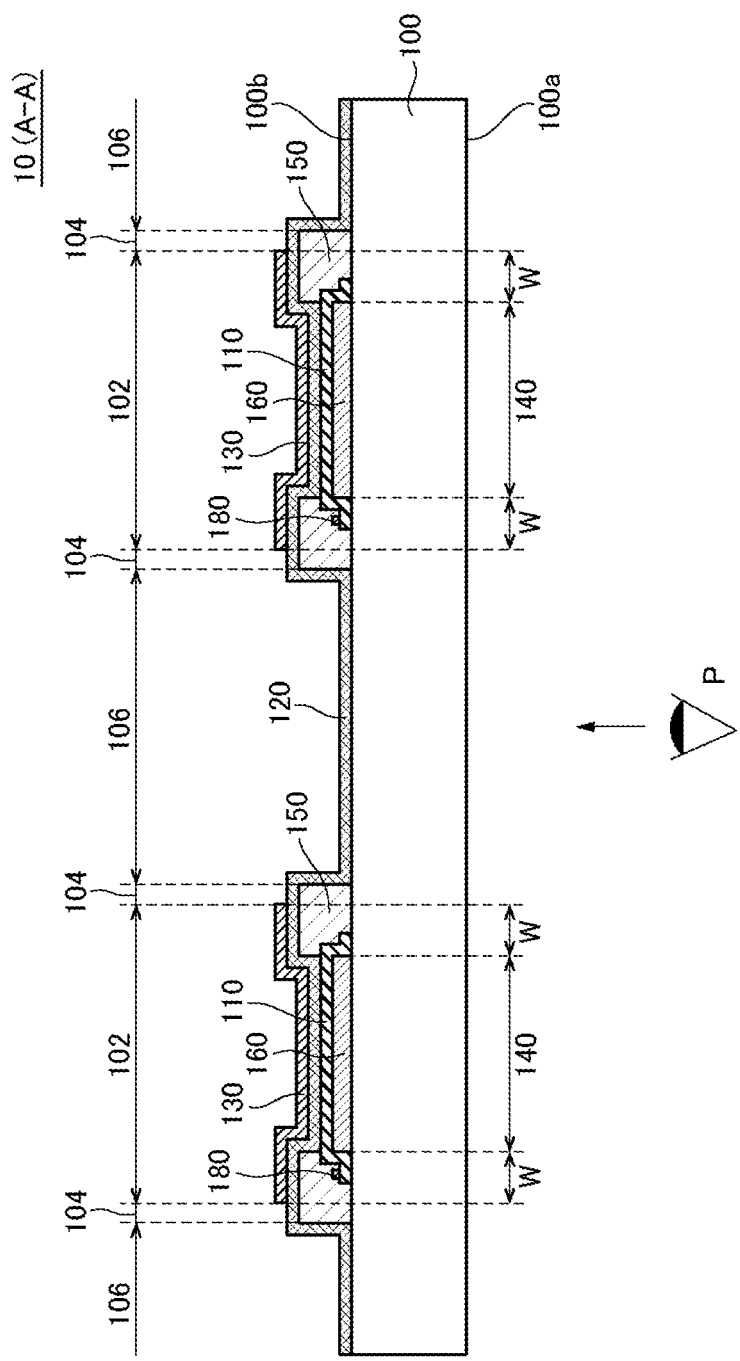
FIG. 5 is a cross-sectional view showing a configuration of a light emitting device according to Modification Example 3.

FIG. 5 is a cross-sectional view showing a configuration of the light emitting device 10 according to Modification Example 3 and corresponds to FIG. 2 in the embodiment. The light emitting device 10 according to the present modification example has the same configuration as that of the light emitting device 10 according to the embodiment, except that the first electrode 110 has a conductive layer 180. The conductive layer 180 is an auxiliary electrode of the first electrode 110 and has a structure in which, for example, a Mo alloy layer, an Al alloy layer, and a Mo alloy layer are stacked in this order. The conductive layer 180 is formed over a portion of the first electrode 110 covered by the insulating layer 150. However, the conductive layer 180 may be formed between the first electrode 110 and the substrate 100 (or between the first electrode 110 and the optically functional layer 160).

Even in the present modification example, since the optically functional layer 160 is provided, similar to the embodiment, the light from the organic layer 120 is easily radiated to the outside from the first surface 100a. Further, since the edge of the second electrode 130 is located outside the optically functional layer 160, even if the optically functional layer 160 is provided, the light from the light emitting unit 140 is hardly emitted to the side opposite to the first surface 100a. Further, since the conductive layer 180 is provided, the apparent resistance of the first electrode 110 can be lowered.

Further, in Modification Example 1 and Modification Example 2, the light emitting device 10 may have the conductive layer 180.

Modification Example 4

Figure 6:
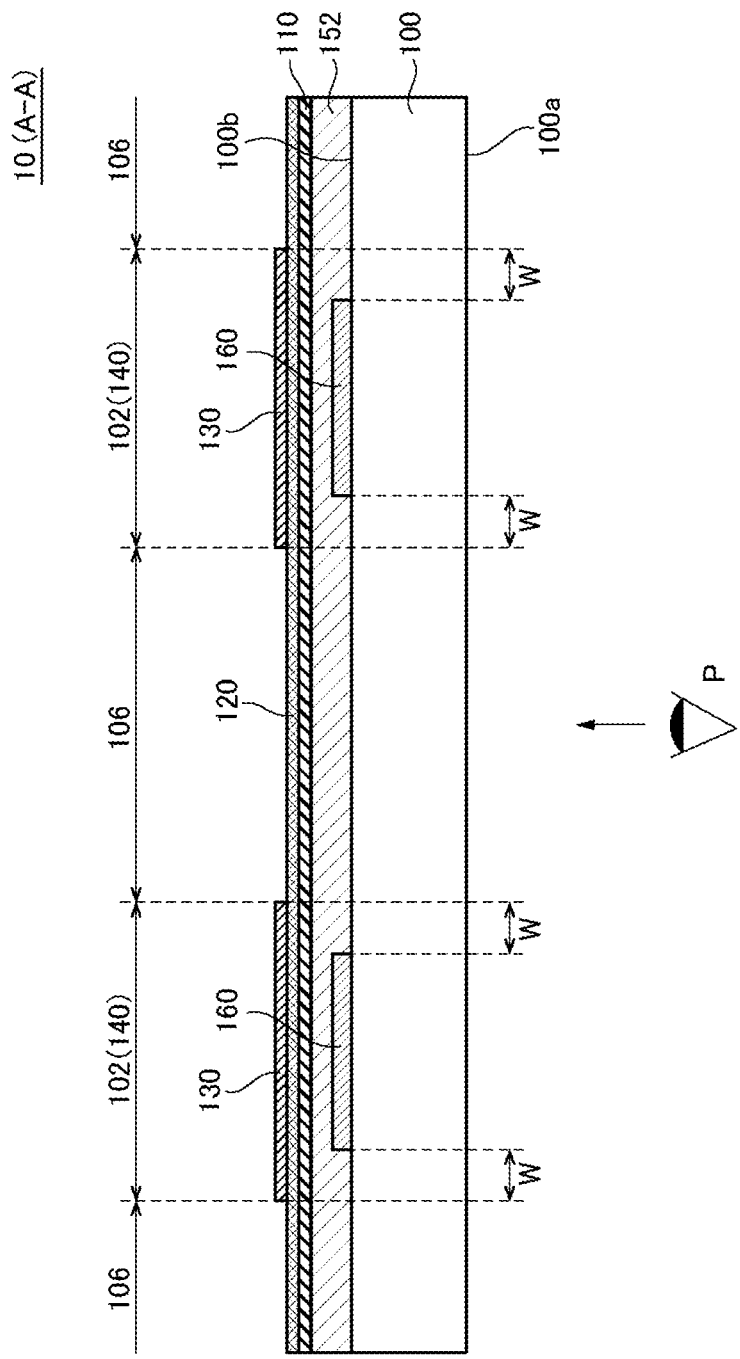
FIG. 6 is a cross-sectional view showing a configuration of a light emitting device according to Modification Example 4.

FIG. 6 is a cross-sectional view showing a configuration of the light emitting device 10 according to Modification Example 4 and corresponds to FIG. 2 in the embodiment. The light emitting device 10 according to the present modification example has the same configuration as that of the light emitting device 10 according to the embodiment, except that the first electrode 110 has a light transmitting layer 152 instead of the insulating layer 150.

The light transmitting layer 152 is a light-transmitting insulating film, and continuously covers a region of the substrate 100 where the optically functional layer 160 is not formed and the optically functional layer 160. Therefore, the light transmitting layer 152 functions as a planarization layer. The light transmitting layer 152 is formed using, for example, a transparent material such as an imide-based, acrylic-based, ether-based, silane-based, or siloxane-based organic material, or an inorganic material such as glass paste, glass frit or $SiO_2$ sol, and has a thickness, for example, 100 nm or more and 100 μm or less. The light transmitting layer 152 is formed by using, for example, an inkjet method or a coating method.

Then, the first electrode 110 and the organic layer 120 are continuously formed over the light transmitting layer 152. On the other hand, the second electrode 130 has the same layout as that of the embodiment. In the present modification example, the light emitting device 10 has the first region 102 and the third region 106 but does not have the second region 104. The first region 102 coincides with the light emitting unit 140.

Even in the present modification example, since the optically functional layer 160 is provided, similar to the embodiment, the light from the organic layer 120 is easily radiated to the outside from the first surface 100a. Further, since the edge of the second electrode 130 is located outside the optically functional layer 160, even if the optically functional layer 160 is provided, the light from the light emitting unit 140 is hardly emitted to the side opposite to the first surface 100a.

In Modification Examples 1 to 3, the light transmitting layer 152 shown in the present modification example may be provided instead of the insulating layer 150.

Modification Example 5

Figure 7:
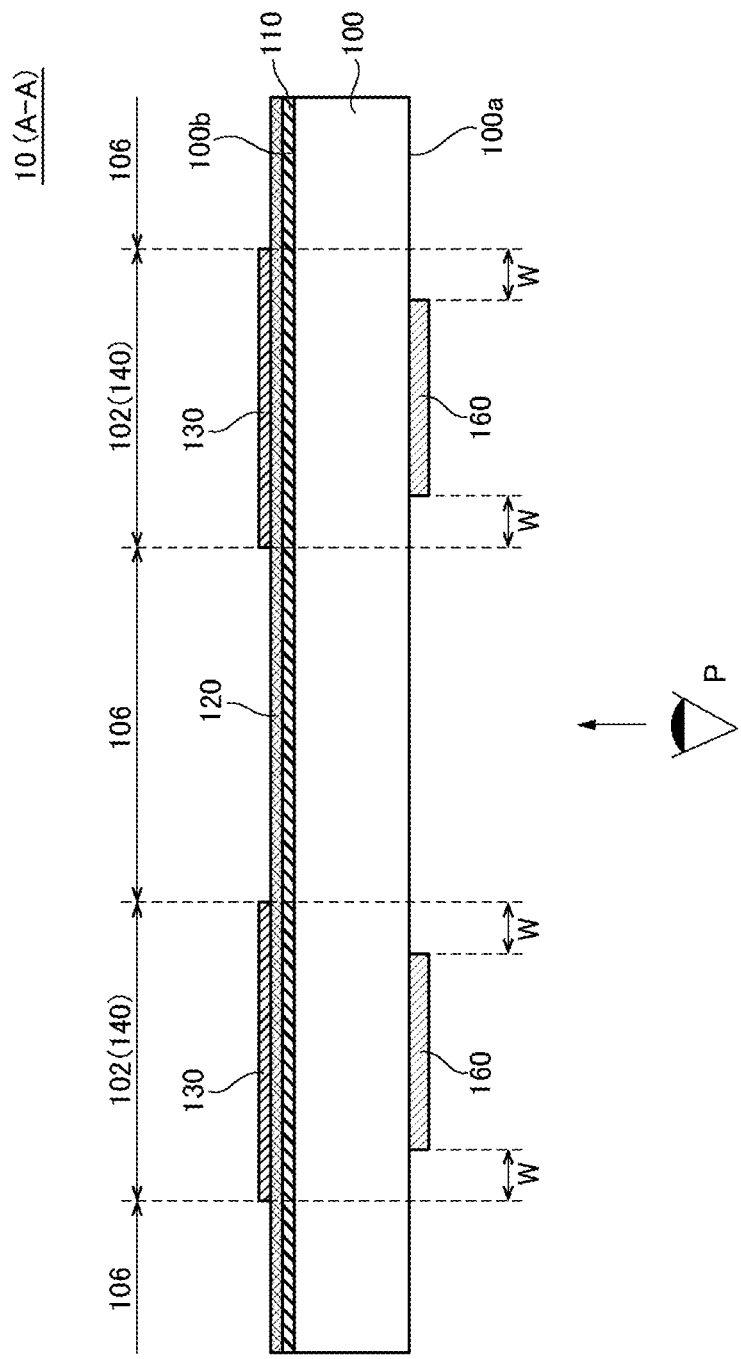
FIG. 7 is a cross-sectional view showing a configuration of a light emitting device according to Modification Example 5.

FIG. 7 is a cross-sectional view showing a configuration of the light emitting device 10 according to Modification Example 5 and corresponds to FIG. 6 in Modification Example 4. The light emitting device 10 according to the present modification example has the same configuration as that of the light emitting device 10 according to Modification Example 4, except for the following points.

First, the light emitting device 10 does not have the light transmitting layer 152. Therefore, the first electrode 110 is formed directly on the substrate 100. The optically functional layer 160 is formed on a surface of the substrate 100 opposite to the light emitting unit 140. However, when viewed from the direction perpendicular to the substrate 100, the position and size of the optically functional layer 160 with respect to the second electrode 130 are the same as those in Modification Example 4.

Even in the present modification example, since the optically functional layer 160 is provided, similar to the embodiment, the light from the organic layer 120 is easily radiated to the outside from the first surface 100a. Further, since the edge of the second electrode 130 is located outside the optically functional layer 160, even if the optically functional layer 160 is provided, the light from the light emitting unit 140 is hardly emitted to the side opposite to the first surface 100a.

Modification Example 6

Figure 8:
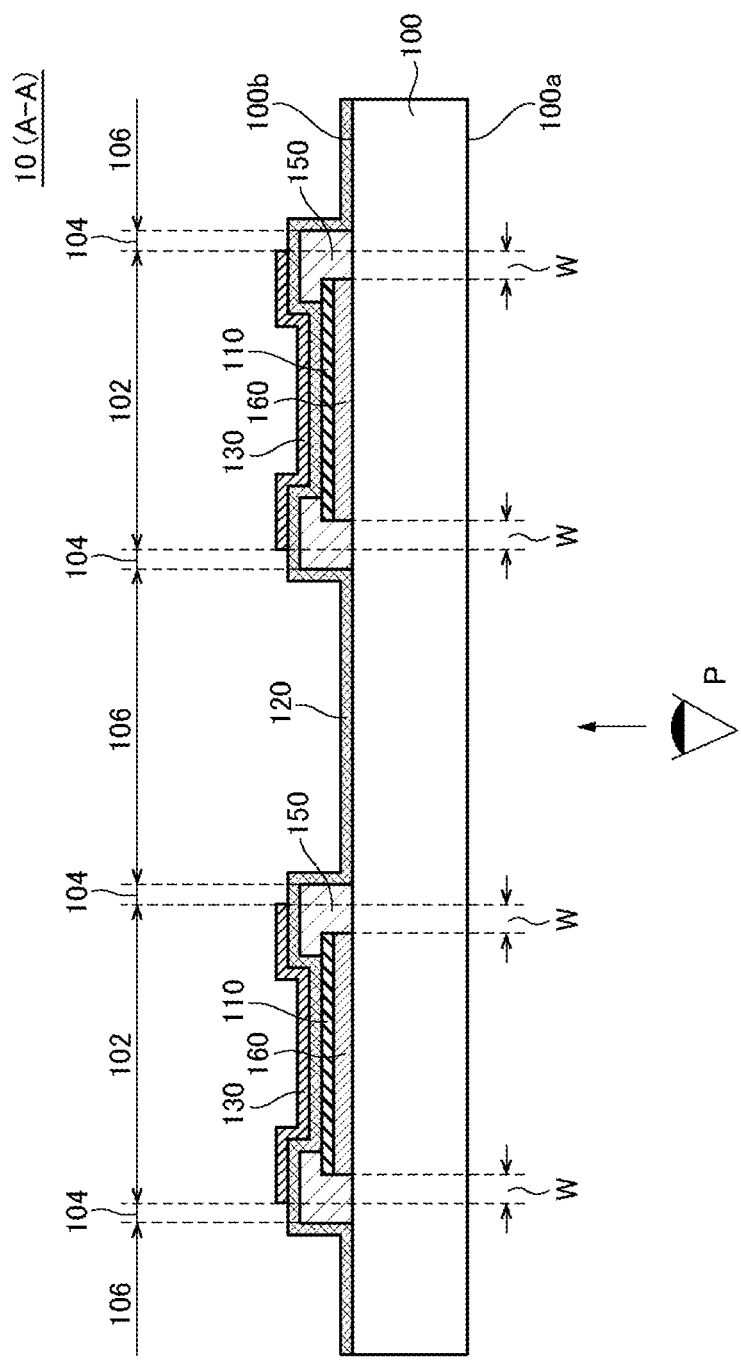
FIG. 8 is a cross-sectional view showing a configuration of a light emitting device according to Modification Example 6.

FIG. 8 is a cross-sectional view showing a configuration of the light emitting device 10 according to Modification Example 6 and corresponds to FIG. 2 in the embodiment. The light emitting device 10 according to the present modification example has the same configuration as that of the light emitting device 10 according to the embodiment, except that the edge of the first electrode 110 is located over the optically functional layer 160. In the present modification example, the first electrode 110 is located in the first region 102 but is neither located in the second region 104 nor the third region 106. In addition, in the present modification example, the light emitting device 10 may have the conductive layer 180 shown in Modification Example 3.

Even in the present modification example, since the optically functional layer 160 is provided, similar to the embodiment, the light from the organic layer 120 is easily radiated to the outside from the first surface 100a. Further, since the edge of the second electrode 130 is located outside the optically functional layer 160, even if the optically functional layer 160 is provided, the light from the light emitting unit 140 is hardly emitted to the side opposite to the first surface 100a.

Modification Example 7

Figure 9:
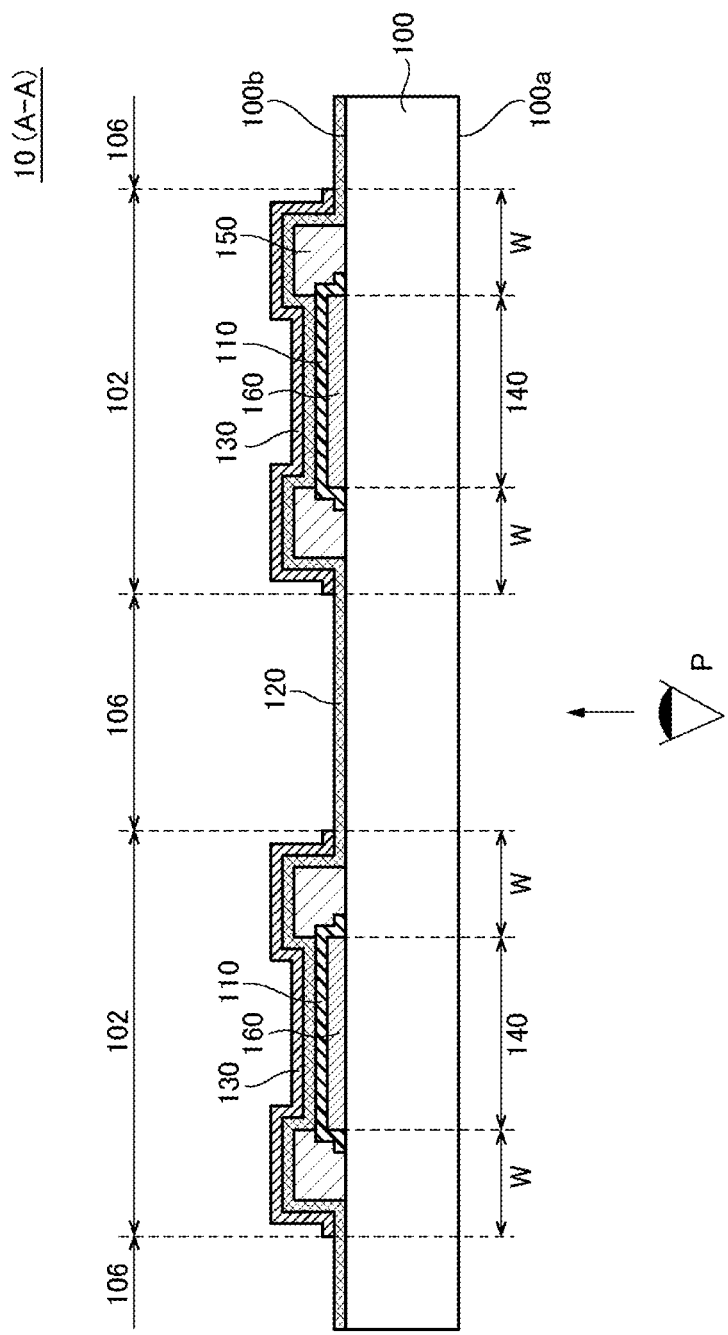
FIG. 9 is a cross-sectional view showing a configuration of a light emitting device according to Modification Example 7.

FIG. 9 is a cross-sectional view showing a configuration of the light emitting device 10 according to Modification Example 7 and corresponds to FIG. 2 in the embodiment. The light emitting device 10 according to the present modification example has the same configuration as that of the light emitting device 10 according to the embodiment, except that the edge of the second electrode 130 is located outside the insulating layer 150. In other words, in the present modification example, the width of the second electrode 130 is wider as that in the embodiment, and as a result, the distance w between the edge of the optically functional layer 160 and the edge of the second electrode 130 is wider than that in the embodiment. In addition, in the present modification example, the light emitting device 10 may have the conductive layer 180 shown in Modification Example 3.

According to the present modification example, since the optically functional layer 160 is provided, similar to the embodiment, the light from the organic layer 120 is easily radiated to the outside from the first surface 100a. Further, since the width of the second electrode 130 is wider than that in the embodiment, the light from the light emitting unit 140 is more hardly emitted to the side opposite to the first surface 100a.

Example 1

Figure 10:
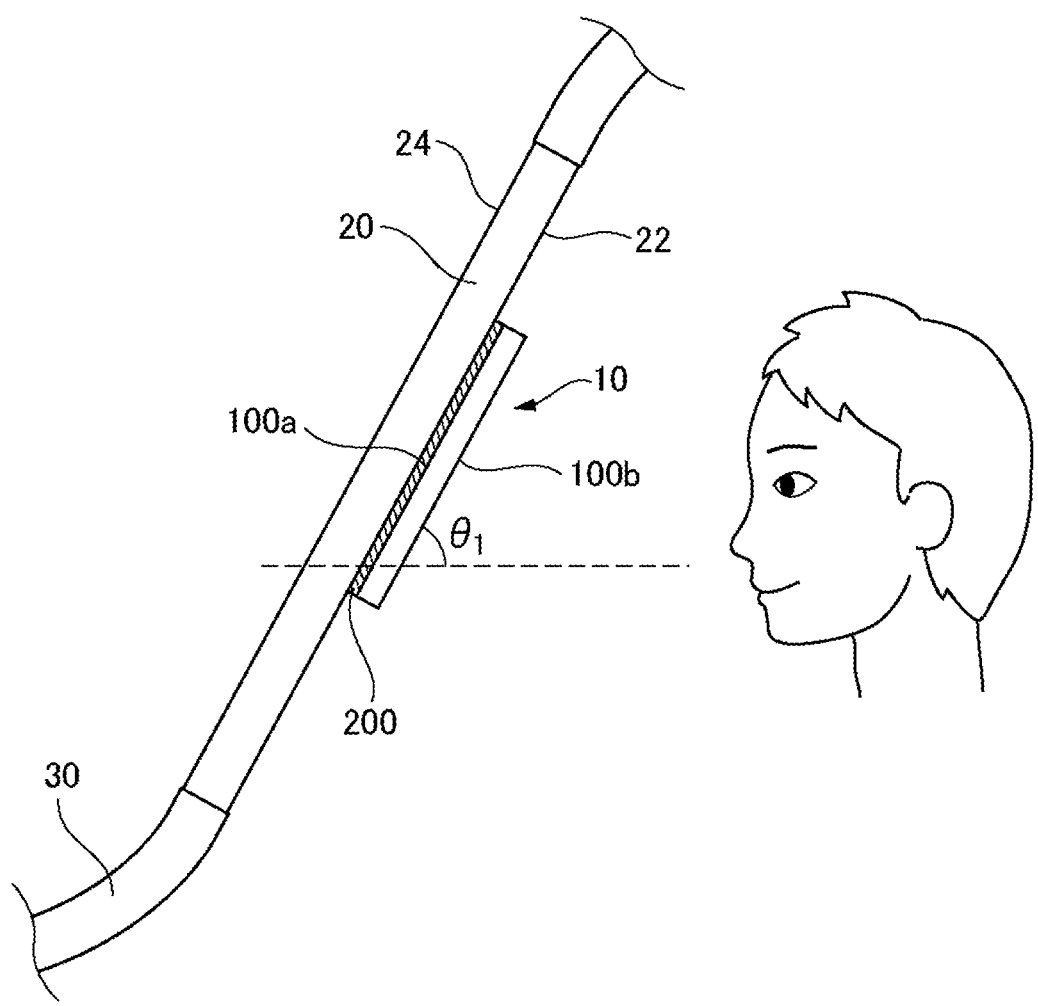
FIG. 10 is a cross-sectional view showing a configuration of a light emitting system according to Example 1.

FIG. 10 is a cross-sectional view showing a configuration of a light emitting system according to Example 1. This light emitting system has a light emitting device 10 and a partition member 20. The partition member 20 has light transmittance and partitions a space occupied by a person from the outside. The light emitting device 10 has the same configuration as any of the above-described embodiment and modification examples. The light emitting unit 140 is disposed on a surface (second surface 100b) of the substrate 100 on the side of the space occupied by a person. In this state, the light-transmitting first electrode 110, the organic layer 120, and the second electrode 130 overlap in this order from the outside.

The partition member 20 is, for example, a window a moving body 30 for transporting a person and is formed using glass or a light-transmitting resin. The moving body 30 is, for example, an automobile, a train, or an airplane. In a case where the moving body 30 is an automobile, the partition member 20 is a windshield, a rear window, or a window glass (for example, a door glass) attached to the side of the seat. In a case where the partition member 20 is a rear window, the plurality of light emitting units 140 function as, for example, a brake lamp. Further, in a case where the partition member 20 is a windshield or a rear window, the plurality of light emitting units 140 may be indicator lamps. Alternatively, the partition member may be a window that partitions the inside and the outside of a room such as a conference room. The light emitting system may be capable of allowing to discriminate whether or not the conference room is being used by lit state/non-lit state of the light emitting units 140.

A surface of the light emitting device 10 on the light extraction side (for example, the first surface 100a of the substrate 100) is fixed to an inner surface (the first surface 22) of the partition member 20 through an adhesive layer 200. Therefore, the light radiated from the light emitting unit 140 of the light emitting device 10 is radiated to the outside of the moving body 30 through the partition member 20. Meanwhile, the light emitting device 10 has optical transparency. Therefore, a person inside the moving body 30 can visually recognize the outside of the moving body 30 through the partition member 20. Note that the entire surface of the first surface 100a of the substrate 100 may be fixed to the first surface 22 of the partition member 20 through the adhesive layer 200, or a part of the first surface 100a (for example, two opposing sides) may be fixed to the first surface 22 of the partition member 20.

The adhesive layer 200 bonds the partition member 20 to the light emitting device 10 to each other. There is no particular limitation as long as the material of the adhesive layer fulfills such a function. In a case where the refractive index of the partition member 20 and the refractive index of the substrate 100 of the light emitting device 10 are the same as in the case where both are formed of glass, for example, an adhesive layer 200 having the same or close refractive index as or to the refractive indices of both is used. On the other hand, in a case where the partition member 20 and the substrate 100 have different refractive indices (for example, the partition member 20 is formed of plastic and the substrate 100 is formed of glass), the refractive index of the adhesive layer 200 is preferably a numerical value between the partition member 20 and the substrate 100. With such a configuration, the light emitted from the light emitting device 10 can be efficiently extracted to the outside through the partition member 20. In addition, the light emitting device 10 and the partition member 20 are preferably adhered without a gap. This is because when there is a gap, the light emitted from the light emitting device 10 is reflected by the partition member 20 and the reflected light is transmitted to the inside through the second region 104 and the third region 106 of the light emitting device 10.

The light emitting device 10 has the structure shown in any of the embodiments and each of the modification examples. Therefore, the light emitting device 10 has high light extraction efficiency. Further, it is possible to suppress the radiation of light from the light emitting device 10 to the inside of the moving body 30. Therefore, the visibility from the inside to the outside of the moving body 30 does not decrease due to the light from the light emitting unit 140.

In addition, although the insulating layer 150 is formed of a light-transmitting material, in general, the light transmittance of a light-transmitting material varies depending on the wavelength of light. Therefore, if the width of the insulating layer 150 is wide, the spectral distribution of the light changes when the light passes through the insulating layer 150. In this case, when an object is looked at through the light emitting device 10, the color of the object looks different from the actual color. That is, the color of the object changes through the light emitting device 10. For example, when the absorption of blue wavelength 400 nm to 600 nm is 50% and is higher than the absorption of other wavelengths, blue color weakens and the object looks yellowish when viewed through the light emitting device 10. In contrast, in the present example, since the width of the second region 104 is narrower than the width of the third region 106, it is possible to suppress the color change described above.

In the example shown in FIG. 10, the partition member 20 is inclined at an angle $\Theta_1$ ($0° < \Theta_1 < 90°$) with respect to the horizontal plane. Therefore, the substrate 100 of the light emitting device 10 is also inclined at an angle $\Theta_1$ ($0° < \Theta_1 < 90°$) with respect to the horizontal plane.

Figure 11:
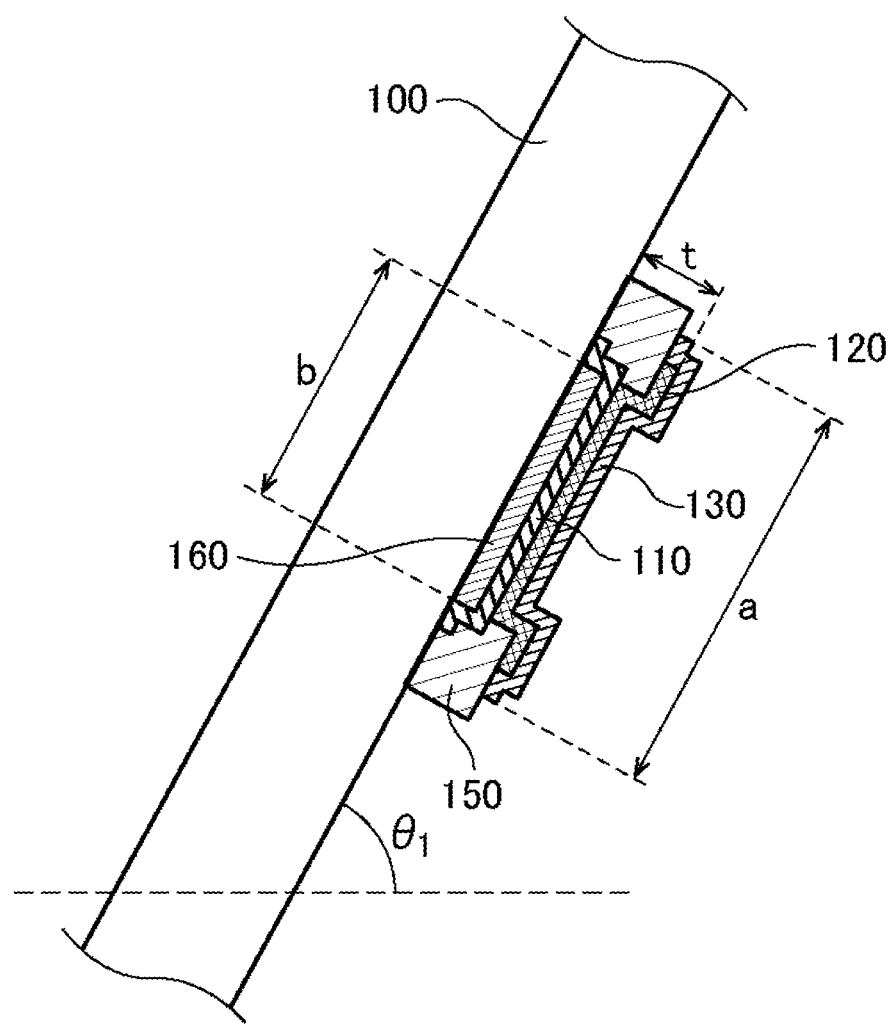
FIG. 11 is an enlarged view of a part of FIG. 10.

FIG. 11 is an enlarged view of a part of FIG. 10. As described above, the substrate 100 of the light emitting device 10 is inclined at an angle $\Theta 1$ ($0° < \Theta 1 < 90°$) with respect to the horizontal plane. Here, when the width of the second electrode 130 is "a", the width of the optically functional layer 160 is "b", and the height of the second electrode 130 with respect to the second surface 100b (the surface on which the optically functional layer 160 is formed) of the substrate 100 is "t", the following Expression (1) is satisfied:

$$A \geq b + 2t/\times \tan \Theta 1 \quad (1).$$

In this way, even if part of the light from the light emitting unit 140 is reflected by the optically functional layer 160, the reflected light is hardly radiated from the optically functional layer 160 in the direction lower than the horizontal direction in FIG. 11. Accordingly, the visibility from the inside to the outside of the moving body 30 is hardly lowered further.

Figure 12:
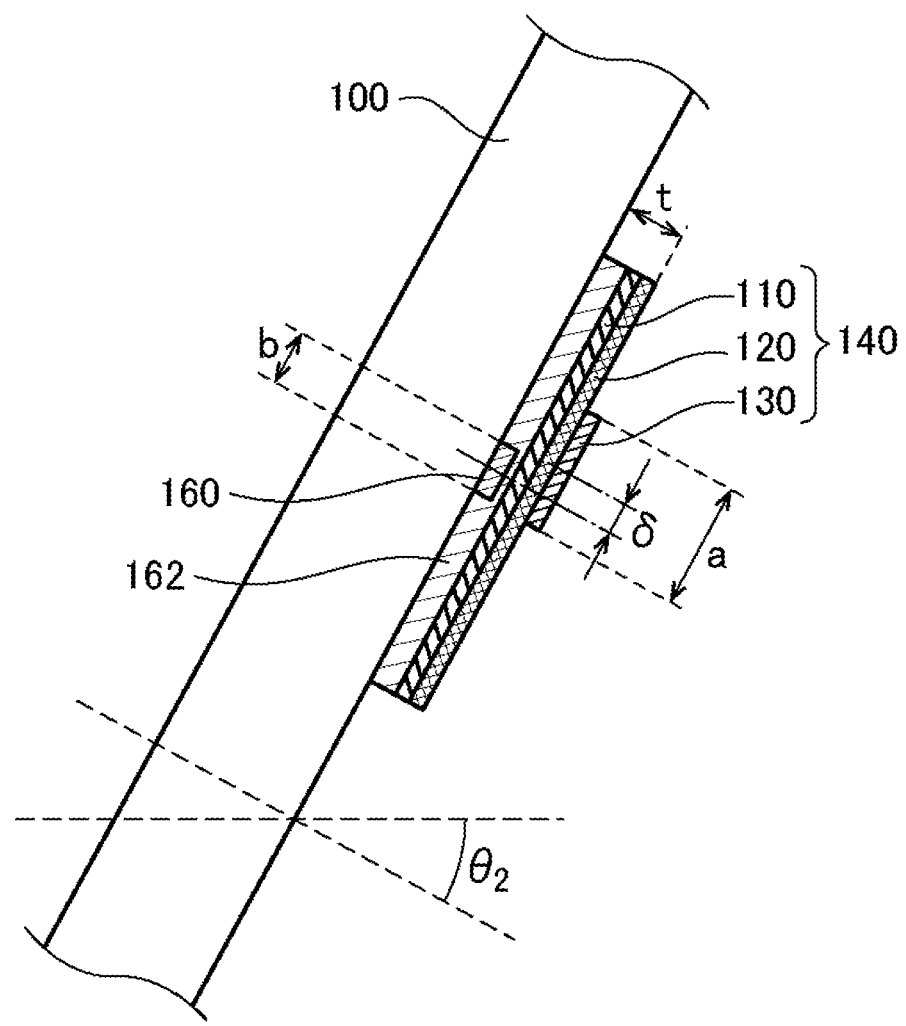
FIG. 12 is a diagram showing a modification example of FIG. 11.

Further, as shown in FIG. 12, the center of the optically functional layer 160 and the center of the second electrode 130 need not overlap. For example, when the height of the second electrode 130 is t and the tilt angle of the light emitting device 10 (an angle between the vertical line of the substrate 100 and the horizontal plane) is $\Theta_2$ with the second surface 100b (the surface on which the optically functional layer 160 is formed) of the substrate 100 as a reference, the width of the second electrode 130 may be made wider than the width b of the optically functional layer 160 just by t·tan $\Theta_2$ on one side. In FIG. 12, a planarization layer 162 is formed between the first electrode 110 and the second surface 100b of the substrate 100. The planarization layer 162 is formed using an insulating material such as a resin, for example, and flattens the irregularities caused by the presence or absence of the optically functional layer 160.

Example 2

Figure 13:
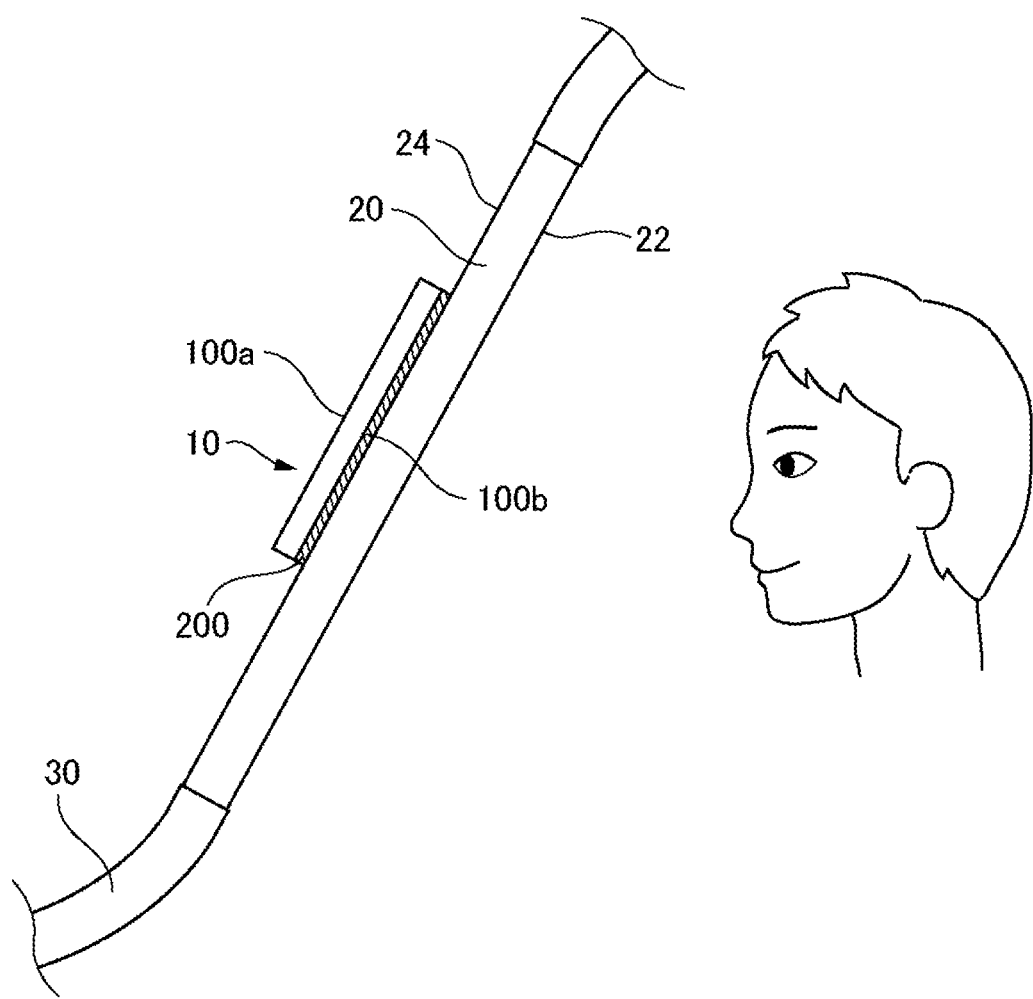
FIG. 13 is a cross-sectional view showing a configuration of a light emitting system according to Example 2.

FIG. 13 is a cross-sectional view showing a configuration of a light emitting system according to Example 2. The light emitting system according to the present example has the same configuration as the light emitting system according to the example, except that the light emitting device 10 is attached to the partition member 20 on the outer surface (the second surface 24) of the moving body 30.

The light emitting device 10 according to the present example has the same configuration as any of the above-described embodiments and modification examples. However, in the light emitting device 10, the surface on the side opposite to the partition member 20 is the light extraction surface. To achieve such configuration, the second surface 100b side of the light emitting device 10 may be opposed to the partition member 20.

According to the present example, similar to Example 1, a person inside the moving body 30 can visually recognize the outside of the moving body 30 through the light emitting device 10 and the partition member 20. In addition, the light emitting device 10 has high light extraction efficiency. Further, it is possible to suppress the radiation of light from the light emitting device 10 to the inside of the moving body 30. Therefore, the visibility from the inside to the outside of the moving body 30 does not decrease due to the light from the light emitting unit 140.

Further, the light from the light emitting device 10 is directly radiated to the outside of the moving body 30 without passing through the partition member 20. Therefore, compared to the embodiment, a person outside the moving body 30 can easily recognize the light from the light emitting device 10. Further, since the light emitting device 10 is attached to the outside of the moving body 30, that is, the second surface 24 side of the partition member 20, it is possible to suppress the light emitted from the light emitting device 10 from being reflected by the partition member 20 and entering the inside of the moving body 30.

Example 3

Figure 14:
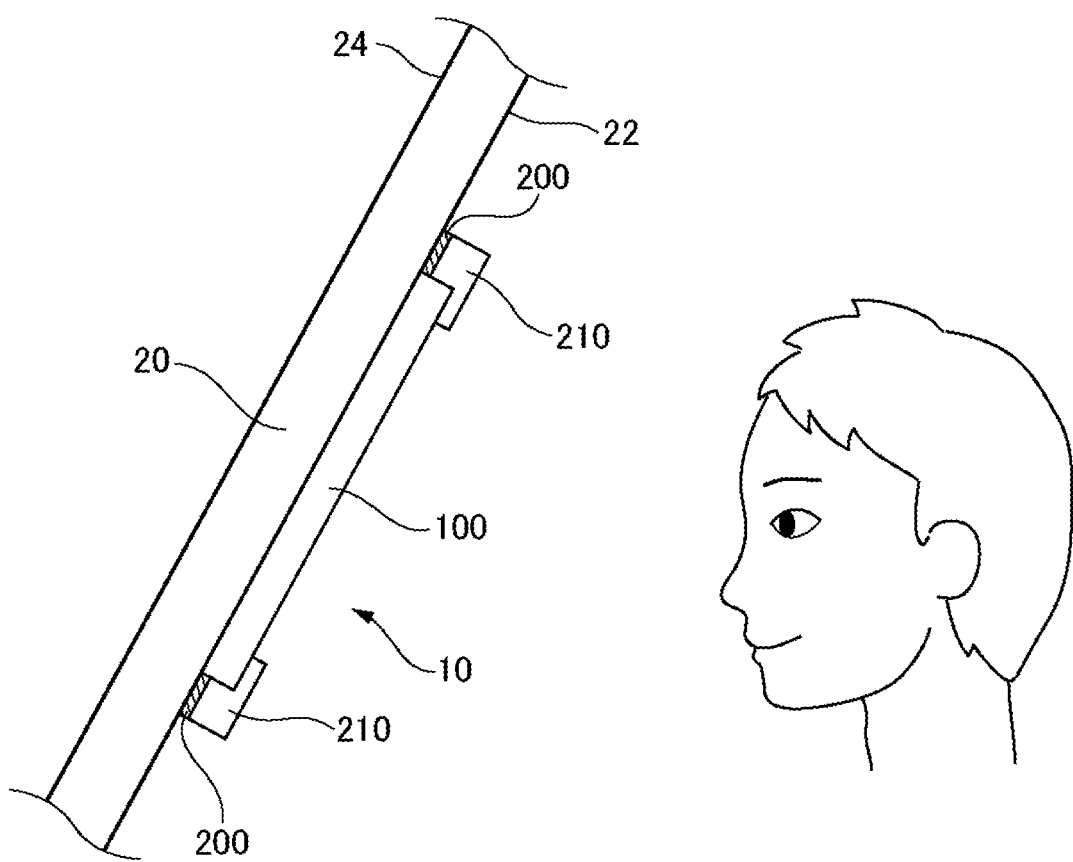
FIG. 14 is a cross-sectional view showing a configuration of a light emitting system according to Example 3.

FIG. 14 is a cross-sectional view showing a configuration of a light emitting system according to Example 3. The light emitting system according to the present example has the same configuration as the light emitting system according to Example 1, except that the light emitting device 10 is fixed to the partition member 20 using a fixing member 210.

The fixing member 210 is a frame-like member, and the lower surface thereof is fixed to the partition member 20 using the adhesive layer 200. The upper portion of the fixing member 210 is bent toward the inside of the fixing member 210, and the bent portion presses the edge of the light emitting device 10. However, the shape of the fixing member 210 is not limited to the example shown in FIG. 14.

According to the present example, similar to Example 1, a person inside the moving body 30 can visually recognize the outside of the moving body 30 through the light emitting device 10 and the partition member 20. In addition, the light emitting device 10 has high light extraction efficiency. Further, it is possible to suppress the radiation of light from the light emitting device 10 to the inside of the moving body 30. Therefore, the visibility from the inside to the outside of the moving body 30 does not decrease due to the light from the light emitting unit 140.

Figure 15:
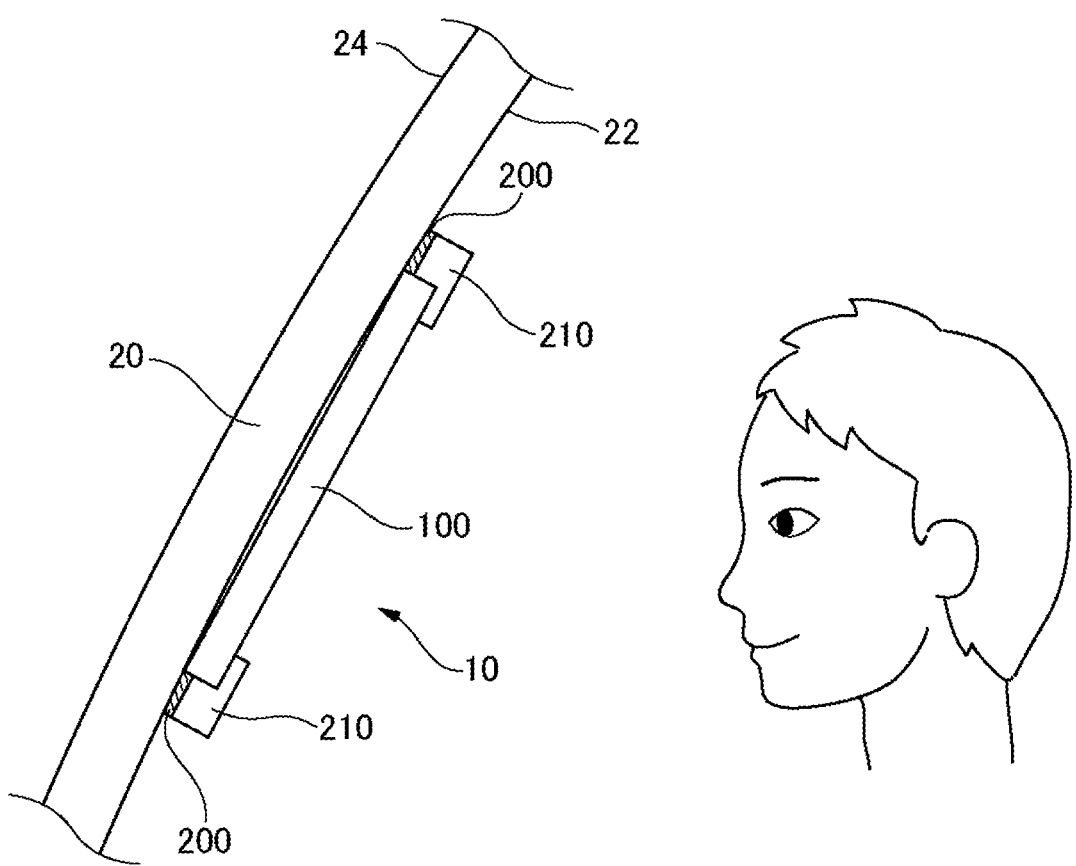
FIG. 15 is a cross-sectional view showing a modification example of FIG. 14.

In addition, as shown in FIG. 15, the partition member 20 may be curved in a direction that protrudes toward the outside of the moving body 30 in some cases. In such a case, it is difficult to directly fix the flat light emitting device 10 on the inner surface (the first surface 22) of the partition member 20. However, if the fixing member 210 is used, even in such a case, the light emitting device 10 can be fixed to the first surface 22 of the partition member 20.

In a case where the curved partition member 20 and the flat light emitting device 10 are fixed by such a method, a filler may be filled in a gap between the partition member 20 and the light emitting device 10. As described above, this is because when there is a gap, the light emitted from the light emitting device 10 is reflected by the partition member 20 and the reflected light is transmitted to the inside through the second region 104 and the third region 106 of the light emitting device 10. In a case where the refractive index of the partition member 20 and the refractive index of the substrate 100 of the light emitting device 10 are substantially equal (for example, in a case where both are formed of glass), the refractive index of the filling member is preferably the same as or close to the refractive indices. Further, in a case where the partition member 20 and the substrate 100 have different refractive indices (for example, the partition member 20 is formed of plastic and the substrate 100 is formed of glass), the refractive index of the filler is preferably a numerical value between the refractive index of the partition member 20 and the refractive index of the substrate 100 of the light emitting device 10.

Example 4

Figure 16:
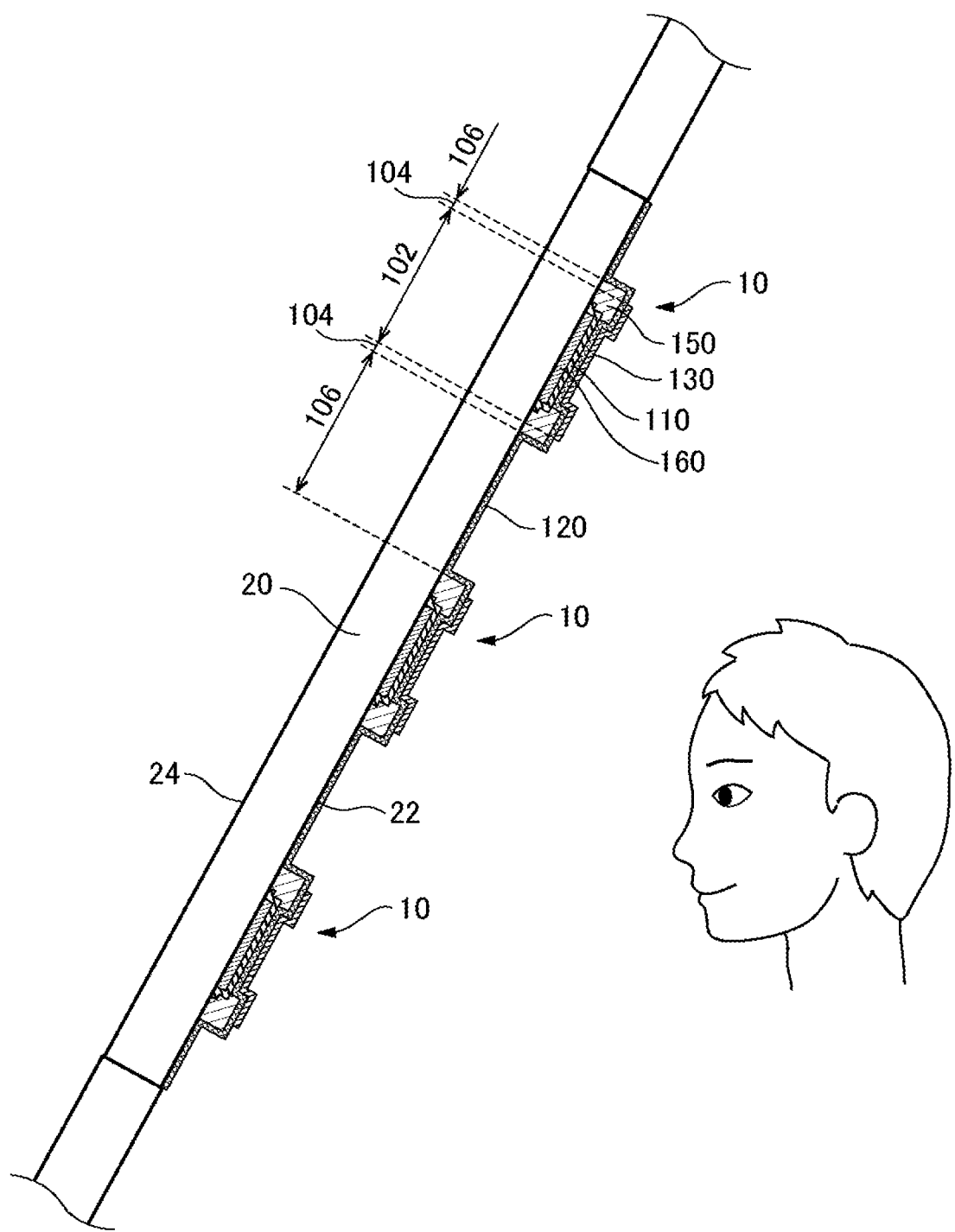
FIG. 16 is a cross-sectional view showing a configuration of a light emitting system according to Example 4.

FIG. 16 is a cross-sectional view showing a configuration of a light emitting system according to Example 4. The light emitting system according to the present example has the same configuration as the light emitting system according to Example 1, except that the light emitting unit 140 is formed on the first surface 22 or the second surface 24 of the partition member 20. In other words, in the present example, the partition member 20 also functions as the substrate 100 in Example 1.

In the present example, a recessed portion may be formed on the surface of the partition member 20 on which the light emitting unit 140 is formed, and the light emitting unit 140 may be formed in the recessed portion. For example, one recessed portion may be formed in an region where a plurality of light emitting units 140 are formed and the plurality of light emitting units 140 may be formed on the bottom surface of the recessed portion, or a recessed portion may be individually formed for each of the plurality of light emitting units 140. In this case, the sealing of the light emitting unit 140 may be a highly transparent configuration, for example, a configuration for sealing the plurality of recessed portions at once by film sealing or the like. It is possible to suppress the light emitting unit 140 from protruding from the partition member 20 even in a case where individual or plural recessed portions are provided for the light emitting unit 140. In the case where the light emitting unit 140 is formed in the recessed portion of the partition member 20, the upper portion of the light emitting unit 140 may protrude from the first surface 22 (or the second surface 24) of the partition member 20, or the whole light emitting unit 140 may be located below the first surface 22 (or the second surface 24).

According to the present example, similar to Example 1, a person inside the moving body 30 can visually recognize the outside of the moving body 30 through the light emitting device 10 and the partition member 20. In addition, the light emitting device 10 has high light extraction efficiency. Further, it is possible to suppress the radiation of light from the light emitting device 10 to the inside of the moving body 30. Therefore, the visibility from the inside to the outside of the moving body 30 does not decrease due to the light from the light emitting unit 140. Further, since the light emitting system does not include a substrate 100, the manufacturing cost of the light emitting system is reduced.

Example 5

Figure 17:
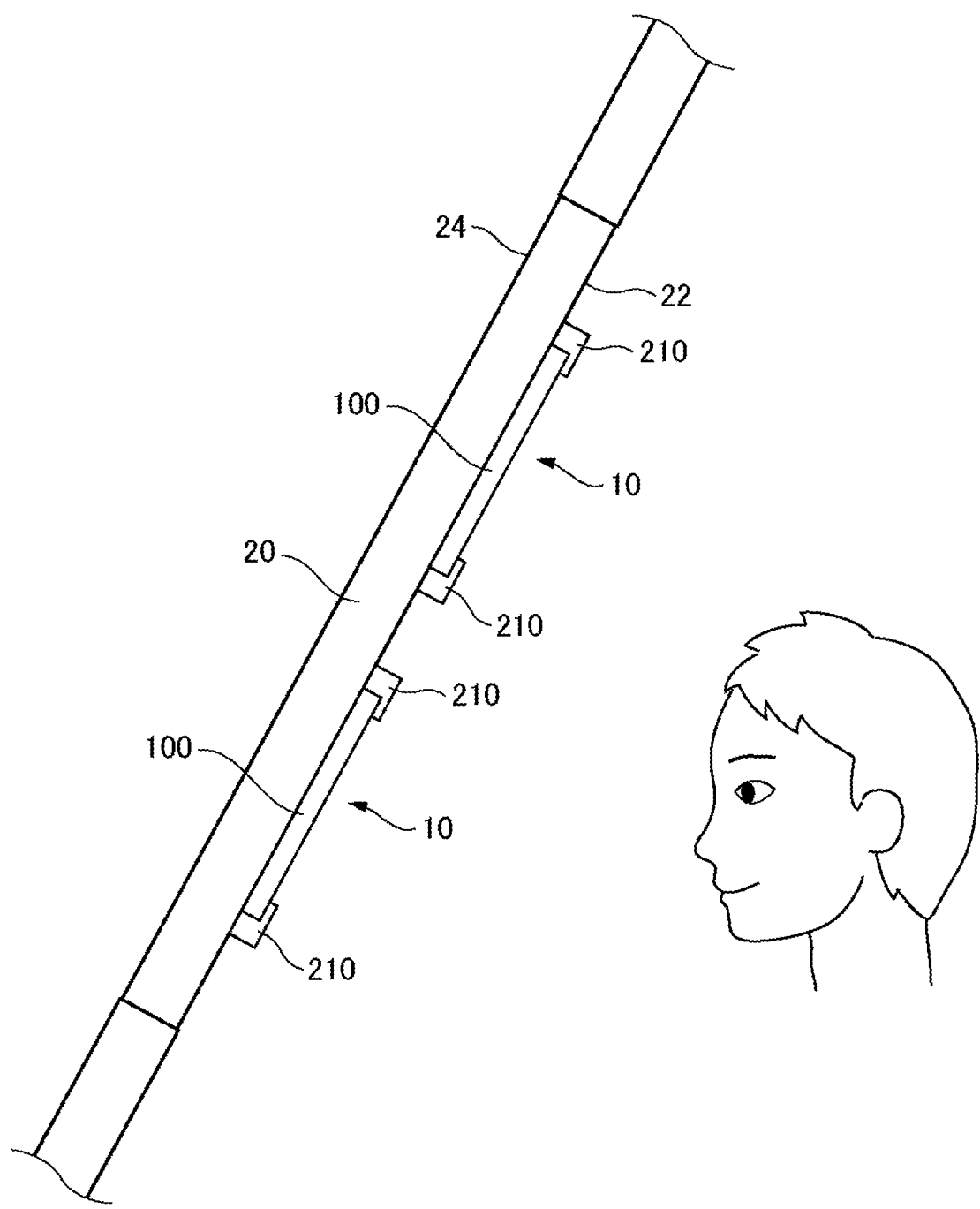
FIG. 17 is a cross-sectional view showing a configuration of a light emitting system according to Example 5.

FIG. 17 is a cross-sectional view showing a configuration of a light emitting system according to Example 5. The light emitting system according to the present example has the same configuration as any one of the above-described embodiment, each modification example, and Examples 1 to 4, except that a plurality of light emitting devices 10 are attached to the partition member 20. The plurality of light emitting devices 10 may be controlled to turn on or turn off light according to the same control signal or may be controlled to turn on or turn off light according to different control signals.

According to the present example, a person inside the moving body 30 can visually recognize the outside of the moving body 30 through the light emitting device 10 and the partition member 20. In addition, the light emitting device 10 has high light extraction efficiency. Further, it is possible to suppress the radiation of light from the light emitting device 10 to the inside of the moving body 30. Therefore, the visibility from the inside to the outside of the moving body 30 does not decrease due to the light from the light emitting unit 140.

Although the embodiments and examples have been described above with reference to the drawings, these are examples of the present invention, and various configurations other than the above can be adopted.

The invention claimed is:
1. A light emitting device comprising:
a substrate;
an optically functional layer located over a part of the substrate;
a light-transmissive first electrode located over the optically functional layer and contacting an entire side edge of the optically functional layer when viewed from a direction parallel to a surface of the substrate on which the optically functional layer is located;
a light-reflective second electrode located over the first electrode; and
an organic layer located between the first electrode and the second electrode, and
an insulating layer covering an edge of the first electrode, wherein a plurality of the second electrodes are formed over the substrate,
wherein at least a part of a region between the plurality of the second electrodes has optical transparency,
wherein, when viewed from a direction perpendicular to the substrate, at least a part of an edge of the second electrode is located outside the optically functional layer,
wherein a plurality of the insulating layers are formed over the substrate, and
wherein at least a part of a region between the plurality of the insulating layers does not overlap with the second electrode along tile direction perpendicular to the substrate.

2. The light emitting device according to claim 1, wherein a distance between the edge of the second electrode and an edge of the optically functional layer is 1 µm or more in at least the part of the edge of the second electrode.

3. The light emitting device according to claim 1, wherein the light emitting device further comprises a plurality of the optically functional layers, and wherein the plurality of the optically functional layers and the plurality of the second electrodes extend in a striped pattern, and
wherein each of the plurality of second electrodes is provided at each of positions overlapping each of the plurality of the optically functional layers along the direction perpendicular to the substrate.

4. The light emitting device according to claim 3, wherein the substrate has an inclination angle $\Theta 1$ ($0° < \Theta 1 < 90°$) with respect to a horizontal direction, and
wherein when a width of the second electrode is "a", a width of the optically functional layer is "b", and a height of the second electrode is "t" with a surface of the substrate on which the optically functional layer is formed as a reference, $a \geq b + 2t/\tan \Theta 1$ is satisfied.

5. The light emitting device according to claim 1, wherein the substrate comprises:
   a first region corresponding to the second electrode along the direction perpendicular to the substrate;
   a second region corresponding to the insulating layer along the direction perpendicular to the substrate, wherein the second electrode does not overlap the insulating layer along the direction perpendicular to the substrate in the second region; and
   a third region which corresponds to neither the second electrode nor the insulating layer along the direction perpendicular to the substrate, and
wherein a width of the second region is narrower than a width of the third region.

6. The light emitting device according to claim 1, wherein a region located between the plurality of second electrodes and having optical transparency does not overlap the optically functional layer.

* * * * *